United States Patent
Miyazaki et al.

(10) Patent No.: US 11,723,262 B2
(45) Date of Patent: *Aug. 8, 2023

(54) SUBSTRATE FOR FLEXIBLE DEVICE AND METHOD FOR PRODUCING THE SAME

(71) Applicant: TOYO SEIKAN GROUP HOLDINGS, LTD., Tokyo (JP)

(72) Inventors: Toshihiko Miyazaki, Osaka (JP); Hirohisa Masuda, Osaka (JP); Hiroshi Shimomura, Osaka (JP); Kouji Nanbu, Kudamatsu (JP)

(73) Assignee: TOYO SEIKAN GROUP HOLDINGS, LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/377,246

(22) Filed: Jul. 15, 2021

(65) Prior Publication Data

US 2021/0343956 A1    Nov. 4, 2021

Related U.S. Application Data

(62) Division of application No. 16/088,273, filed as application No. PCT/JP2017/011448 on Mar. 22, 2017, now Pat. No. 11,101,436.

(30) Foreign Application Priority Data

Mar. 28, 2016 (JP) .................. 2016-063335
Mar. 28, 2016 (JP) .................. 2016-063337

(Continued)

(51) Int. Cl.
*H10K 77/10*    (2023.01)
*C03C 3/066*    (2006.01)

(Continued)

(52) U.S. Cl.
CPC ............ *H10K 77/111* (2023.02); *C03C 3/066* (2013.01); *C03C 3/068* (2013.01); *C03C 3/14* (2013.01);

(Continued)

(58) Field of Classification Search
None
See application file for complete search history.

(56) References Cited

U.S. PATENT DOCUMENTS 4,434,030 A    2/1984    Vitkova et al.
5,252,521 A    10/1993    Roberts (Continued)

FOREIGN PATENT DOCUMENTS

CN    102892724 A    1/2013
CN    103180992 A    6/2013

(Continued)

OTHER PUBLICATIONS

International Search Report for PCT/JP2017/011448 dated Jun. 13, 2017 [PCT/ISA/210].

(Continued)

*Primary Examiner* — Seth Dumbris
(74) *Attorney, Agent, or Firm* — Sughrue Mion, PLLC

(57) ABSTRACT

A substrate for flexible device. The substrate has a nickel-plated metal sheet having a nickel-plating layer formed on at least one surface of a metal sheet or a nickel-based sheet, and a glass layer of an electrically-insulating layered bismuth-based glass on a surface of the nickel-plating layer or the nickel-based sheet. An oxide layer having a roughened surface is formed on the surface of the nickel-plating layer or the surface of the nickel-based sheet, and the bismuth-based glass contains 70 to 84% by weight of $Bi_2O_3$, 10 to 12% by weight of ZnO, and 6 to 12% by weight of $B_2O_3$. Also disclosed is a method for producing the substrate for (Continued)

flexible device, a substrate for an organic EL device, a sheet used as a substrate for flexible device, a method for producing the sheet and a bismuth-based lead-free glass composition.

8 Claims, 4 Drawing Sheets

(30) Foreign Application Priority Data

| Mar. 28, 2016 | (JP) | 2016-063341 |
| Feb. 28, 2017 | (JP) | 2017-037333 |
| Mar. 6, 2017 | (JP) | 2017-042159 |
| Mar. 6, 2017 | (JP) | 2017-042160 |

(51) Int. Cl.
```
C03C 3/068      (2006.01)
C03C 3/14       (2006.01)
H10K 50/828     (2023.01)
H10K 71/00      (2023.01)
C03C 8/04       (2006.01)
C03C 8/16       (2006.01)
H10K 30/80      (2023.01)
H10K 102/00     (2023.01)
```

(52) U.S. Cl.
CPC ............. *C03C 8/04* (2013.01); *C03C 8/16* (2013.01); *H10K 50/828* (2023.02); *H10K 71/00* (2023.02); *C03C 2207/00* (2013.01); *H10K 30/80* (2023.02); *H10K 2102/00* (2023.02); *H10K 2102/311* (2023.02); *H10K 2102/351* (2023.02); *Y10T 428/12618* (2015.01)

(56) References Cited

U.S. PATENT DOCUMENTS

| 9,024,312 | B2 | 5/2015 | Fukuda et al. | |
| 9,199,869 | B2 | 12/2015 | Kawaguchi et al. | |
| 11,414,762 | B2* | 8/2022 | Nanbu | C25D 5/50 |
| 2005/0001963 | A1 | 1/2005 | Yokoyama | |
| 2009/0269661 | A1* | 10/2009 | Mori | H01M 50/116 |
| | | | | 429/166 |
| 2011/0218113 | A1* | 9/2011 | Miyata | H01L 39/2461 |
| | | | | 977/932 |
| 2012/0155093 | A1 | 6/2012 | Yamada et al. | |
| 2012/0312369 | A1 | 12/2012 | Hang et al. | |
| 2013/0049062 | A1 | 2/2013 | Hatano et al. | |
| 2013/0125789 | A1 | 5/2013 | Enomoto et al. | |
| 2014/0041712 | A1 | 2/2014 | Mima et al. | |
| 2014/0261897 | A1* | 9/2014 | Wei | C23C 22/83 |
| | | | | 148/284 |
| 2016/0052819 | A1 | 2/2016 | Kawaguchi et al. | |
| 2016/0054151 | A1 | 2/2016 | Nozawa | |

FOREIGN PATENT DOCUMENTS

| CN | 105371740 A | | 3/2016 |
| EP | 2 925 089 A1 | | 9/2015 |
| JP | 09152731 A | * | 6/1997 |
| JP | 2002-015623 A | | 1/2002 |
| JP | 2003-034550 A | | 2/2003 |
| JP | 2003-229069 A | | 8/2003 |
| JP | 2004-171806 A | | 6/2004 |
| JP | 2006-080370 A | | 3/2006 |
| JP | 2006-228647 A | | 8/2006 |
| JP | 2008-243772 A | | 10/2008 |
| JP | 2011-97007 A | | 5/2011 |
| JP | 2011-126722 A | | 6/2011 |
| JP | 2012-41196 A | | 3/2012 |
| JP | 2012-133944 A | | 7/2012 |
| JP | 2012-197185 A | | 10/2012 |
| JP | 2013-045629 A | | 3/2013 |
| JP | 2014-107053 A | | 6/2014 |
| JP | 2015-199620 A | | 11/2015 |
| JP | 2015-199629 A | | 11/2015 |
| TW | 201245090 A1 | | 11/2012 |

OTHER PUBLICATIONS

Office Action dated Sep. 4, 2019 issued by the State Intellectual Property Office of People's Republic of China in counterpart application No. 201780021275.5.
Communication dated Sep. 28, 2020, from the Taiwanese Patent Office in corresponding Application No. 106110063.
Communication dated Jan. 20, 2021 from the Japanese Patent Office in Application No. 2017-042160.
Extended European Search Report dated Oct. 29, 2019 issued by the European Patent Office in counterpart application No. 17774579.1.
Communication dated Sep. 28, 2020, from the Taiwanese Patent Office in Application No. 106110063.

* cited by examiner

SUBSTRATE FOR FLEXIBLE DEVICE AND METHOD FOR PRODUCING THE SAME

CROSS REFERENCE TO RELATED APPLICATIONS

This application is a Rule 53(b) Divisional Application of U.S. application Ser. No. 16/088,273 filed Sep. 25, 2018, which is a National Stage of International Application No. PCT/JP2017/011448 filed Mar. 22, 2017, claiming priority based on Japanese Patent Application Nos. 2016-063335 filed Mar. 28, 2016; 2016-063337 filed Mar. 28, 2016; 2016-063341 filed Mar. 28, 2016; 2017-037333 filed Feb. 28, 2017; 2017-042159 filed Mar. 6, 2017 and 2017-042160 filed Mar. 6, 2017, the disclosures of which are incorporated herein by reference in their respective entireties.

TECHNICAL FIELD

The present invention relates to a substrate for flexible device and a method for producing the same. More specifically, the present invention relates to a substrate for flexible device, which is excellent in moisture barrier properties and adhesion of an insulating layer and free from surface defects, therefore applicable preferably to equipment relating to organic EL, and a method for producing the same.

Further, the present invention relates to a sheet which is used for substrate for flexible device and a method for producing the same. More specifically, it relates to a sheet which is used for substrate for flexible device, which is excellent in adhesion to a glass layer and capable of reducing surface defects of the glass layer to be formed, and a method for producing the same.

Further, the present invention relates to a bismuth-based lead-free glass composition. More specifically, the present invention relates to a bismuth-based lead-free glass composition to effectively prevent occurrence of seeding or cissing/crawling and to form a glass layer with excellent surface smoothness.

BACKGROUND ART

A substrate for flexible device used in an organic EL lighting, an organic EL display, an organic solar cell or the like is required to possess barrier properties such as moisture barrier properties and gas barrier properties, and further smoothness and insulating properties.

Patent document 1 below discloses a structure of an organic EL element prepared by laminating, on a plastic film sheet, a transparent electroconductive layer, an organic light-emitting medium layer and a cathode layer in this order, on which a metal foil is laminated via an adhesive layer. However, the plastic film sheet is unsatisfactory from the viewpoint of moisture barrier properties.

Patent document 2 below discloses a substrate for flexible device provided with a flattening layer of a polyimide resin on a stainless steel sheet. However, it cannot provide satisfactory moisture barrier properties due to the high water-absorbing properties of the polyimide resin.

Patent document 3 below discloses a flexible solar cell sheet prepared by forming a film of silica-based glass on a stainless steel sheet. However, typical silica-based glass has a thermal expansion coefficient smaller than that of stainless steel, and thus, it lacks adhesion to the stainless steel sheet. Another problem of the silica-based glass is that it is vulnerable to bending and impact.

Other documents such as Patent document 4 disclose various glass substrates applicable as substrates for thin film electrical circuits and flexible displays. However, the glass substrates are vulnerable to bending such as twisting, and thus, there has been demand for a substrate for flexible device having higher strength.

For solving these problems, the present inventors propose a metal substrate for flexible device as indicated in Patent document 5. The substrate is prepared by forming on a surface of a metal sheet a nickel-plating layer, and coating an electrically insulating bismuth-based glass on the surface of the nickel-plating layer.

PRIOR ART DOCUMENTS

Patent Documents

Patent Document 1: JP 2004-171806 A
Patent Document 2: JP 2011-97007 A
Patent Document 3: JP 2006-80370 A
Patent Document 4: JP 2012-197185 A
Patent Document 5: JP 2014-107053 A

SUMMARY OF THE INVENTION

Problems to be Solved by the Invention

The metal substrate for flexible device is prepared by coating bismuth-based glass on a metal sheet. Since the metal sheet has excellent mechanical strength and the bismuth-based glass has excellent moisture barrier properties and adhesion to the metal sheet, the substrate has excellent bending resistance and also excellent insulating properties and flatness, and it is light-weight and flexible. However, the surface of the glass layer may have seeding as minute protrusions and cissing as minute recesses. These minute defects may impair smoothness of the glass layer.

The present inventors studied the causes of these minute defects formed on the surface of the glass layer to find that these minute defects on the glass layer surface are formed due to generation of crystals from the glass, rupture trace of bubbles or the like. In particular, it was found that cissing is caused by the influence of surface tension originating from the disturbance of the glass layer due to the rupture trace of bubbles and crystallization of the glass.

Therefore, an object of the present invention is to provide a substrate for flexible device having excellent surface smoothness and a method for producing the same. The substrate for flexible device is excellent in moisture barrier properties and adhesion of glass layer, and at the same time, it can prevent effectively occurrence of seeding and cissing on the glass layer surface.

Another object of the present invention is to provide a sheet which is used for substrate for flexible device and a method for producing the same. The sheet is excellent in adhesion to a glass layer and at the same time, it can prevent effectively occurrence of surface defects such as cissing on the surface of the thus formed glass layer.

A further object of the present invention is to provide a bismuth-based lead-free glass composition that can be used for forming a glass layer having excellent moisture barrier properties and adhesion to a metal substrate and that can prevent effectively occurrence of seeding or cissing.

Means for Solving the Problems

The present invention provides a substrate for flexible device having a nickel-plated metal sheet including a nickel-plating layer formed on at least one surface of a metal sheet or a nickel-based sheet, and a glass layer of an electrically-insulating layered bismuth-based glass on the nickel-plating layer or the nickel-based sheet. An oxide layer having a roughened surface is formed on a surface of the nickel-plating layer or a surface of the nickel-based sheet, and the bismuth-based glass contains 70 to 84% by weight of $Bi_2O_3$, 10 to 12% by weight of ZnO, and 6 to 12% by weight of $B_2O_3$.

It is preferable in the substrate for flexible device that:
1. the bismuth-based glass contains $SiO_2$ and/or $Al_2O_3$, the $SiO_2$ is contained in an amount of 0 to 2% by weight and the $Al_2O_3$ is contained in an amount of 0 to 1% by weight when at least either $SiO_2$ or $Al_2O_3$ is contained in an amount of more than 0% by weight;
2. the bismuth-based glass contains CuO and/or NiO, the CuO is contained in an amount of 0 to 2% by weight and the NiO is contained in an amount of 0 to 2% by weight when at least either CuO or NiO is contained in an amount of more than 0% by weight;
3. the bismuth-based glass contains any of $Y_2O_3$, $ZrO_2$, $La_2O_3$, $CeO_2$, $TiO_2$, CoO and $Fe_2O_3$ in an amount of more than 0% by weight and not more than 1.5% by weight;
4. the oxide layer has a surface having arithmetic mean roughness (Ra) in a range of 30 to 100 nm;
5. the oxide layer has a surface having maximum height roughness (Rz) in a range of 420 to 900 nm;
6. the oxide layer has a thickness in a range of 40 to 1200 nm;
7. the glass layer has a thickness in a range of 2 to 45 μm;
8. iron is present on a surface layer of the nickel-plating layer or a surface layer of the nickel-based sheet;
9. the iron present on the surface layer of the nickel-plating layer or the surface layer of the nickel-based sheet includes metallic iron of not more than 3 atomic %;
10. the surface layer of the nickel-plating layer or the surface layer of the nickel-based sheet contains oxygen of not less than 30 atomic %;
11. the nickel present on the surface layer of the nickel-plating layer or the surface layer of the nickel-based sheet includes metallic nickel of not more than 20 atomic %;
12. when an amount of oxygen on a predetermined plane in the thickness direction of the glass layer is set to 100%, the amount of oxygen on an interface between the glass layer and either the nickel-plating layer or the nickel-based sheet is not less than 80%; and
13. an underlying layer for forming an electrode layer is formed on the surface of the glass layer, and the underlying layer includes either nickel or indium tin oxide.

It is further preferable in the present invention to provide a substrate for flexible device. The substrate has a nickel-plated metal sheet including a nickel-plating layer formed on at least one surface of a metal sheet or a nickel-based sheet, a glass layer of an electrically-insulating layered bismuth-based glass on the nickel-plating layer or the nickel-based sheet, and an underlying layer provided on the surface of the glass layer for forming an electrode layer.

It is preferable in the substrate for flexible device of the present invention that the underlying layer includes any of nickel, indium tin oxide, silver, gold, copper, magnesium-silver, gold-copper, silver-copper, zinc oxide, cobalt, and palladium.

Further, the present invention provides a method for producing a substrate for flexible device, including:

a step of forming an oxide layer by firing (hereinafter, this may be described as "baking") in an oxygen-containing atmosphere a nickel-plated metal sheet having a nickel-plating layer formed on at least one surface of a metal sheet or a nickel-based sheet to form an oxide layer on either a surface of the nickel-plating layer or a surface of the nickel-based sheet, and a step of forming a bismuth-based glass layer containing $Bi_2O_3$, ZnO and $B_2O_3$ on the oxide layer.

It is preferable in the method for producing a substrate for flexible device of the present invention that:
1. the surface of the nickel-plating layer or the nickel-based sheet is baked at a temperature of 550 to 900° C. in the step of forming the oxide layer; and
2. a bismuth-based glass composition coated on either the nickel-plating layer or the nickel-based sheet is fired at a temperature of 550 to 900° C. for 10 to 300 seconds in the step of forming the glass layer.

Further, the present invention provides a substrate for organic EL device, including the substrate for flexible device, an electrode layer formed on either the underlying layer or the glass layer of the substrate for flexible device, an organic thin film light-emitting layer formed on the electrode layer, and a transparent electrode layer formed on the organic thin film light-emitting layer.

The present invention provides a sheet which is used for substrate for flexible device. The sheet includes either a nickel-plated metal sheet including a nickel-plating layer formed on at least one surface of a metal sheet or a nickel-based sheet, wherein a roughened oxide layer is formed on either the surface of the nickel-plating layer or the surface of the nickel-based sheet.

It is preferable in the sheet which is used for substrate for flexible device of the present invention that:
1. the oxide layer has arithmetic mean roughness (Ra) in a range of 30 to 100 nm;
2. the oxide layer has a surface having maximum height roughness (Rz) in a range of 420 to 900 nm;
3. the oxide layer has a thickness in a range of 40 to 1200 nm;
4. the oxide layer has a thickness in a range of 500 to 1000 nm;
5. iron is present on a surface layer of the nickel-plating layer or on a surface layer of the nickel-based sheet;
6. the iron present on the surface layer of the nickel-plating layer or the surface layer of the nickel-based sheet includes metallic iron of not more than 3 atomic %;
7. the surface layer of the nickel-plating layer or the surface layer of the nickel-based sheet contains oxygen of not less than 30 atomic %; and
8. the nickel present on the surface layer of the nickel-plating layer or the surface layer of the nickel-based sheet includes metallic nickel of not more than 20 atomic %.

Further, the present invention provides a method for producing a sheet which is used for substrate for flexible device, including baking in an oxygen-containing atmosphere a nickel-plated metal sheet having a nickel-plating layer formed on at least one surface of a metal sheet or a nickel-based sheet to form an oxide layer on either a surface of the nickel-plating layer or a surface of the nickel-based sheet.

The present invention provides a bismuth-based lead-free glass composition containing 70 to 84% by weight of $Bi_2O_3$, 10 to 12% by weight of ZnO, and 6 to 12% by weight of $B_2O_3$.

It is preferable in the bismuth-based lead-free glass composition of the present invention that:
1. $SiO_2$ and/or $Al_2O_3$ is contained, the $SiO_2$ is contained in an amount of 0 to 2% by weight and the $Al_2O_3$ is contained in an amount of 0 to 1% by weight when at least either $SiO_2$ or $Al_2O_3$ is contained in an amount of more than 0% by weight;

2. CuO and/or NiO is contained, the CuO is contained in an amount of 0 to 2% by weight and the NiO is contained in an amount of 0 to 2% by weight when at least either CuO or NiO is contained in an amount of more than 0% by weight; and 3. any of $Y_2O_3$, $ZrO_2$, $La_2O_3$, $CeO_2$, $TiO_2$, CoO and $Fe_2O_3$ is contained in an amount of more than 0% by weight and not more than 1.5% by weight.

Further, the present invention provides a bismuth-based lead-free glass composition paste including a powder of the glass composition and a vehicle, the glass composition powder has an average particle diameter of not more than 20 μm.

Effects of the Invention

The present invention provides a substrate for flexible device having a glass layer on which generation of crystals (seeding) and cissing is prevented or controlled, thereby imparting excellent surface smoothness and insulating properties. Further, for a substrate for flexible device of the present invention, a metal sheet having a nickel-plating layer or a nickel-based sheet is used and an oxide layer having a roughened surface is formed thereon is used. As a result, the substrate is excellent in adhesion of the glass layer, and it has sufficient flexibility to prevent peeling or the like even if being subjected to a roll-to-roll process.

Moreover, the substrate of the present invention has a glass layer having a dense structure capable of completely preventing moisture permeation, and thus, it has also excellent moisture barrier properties and can be used effectively as a substrate for an organic EL.

In addition to that, since an underlying layer is formed on the glass layer so as to make a ground for forming the electrode layer, adhesion between the electrode layer and the substrate for flexible device is improved to effectively prevent peeling of the electrode layer.

Further, according to the method for producing the substrate for flexible device of the present invention, substrates for flexible device free from surface defects can be manufactured consecutively, which is favorable from the viewpoint of productivity and economy.

In the sheet which is used for substrate for flexible device of the present invention, an oxide layer having a roughened surface is formed on either a surface of a nickel-plating layer of a nickel-plated metal sheet or a surface of a nickel-based sheet. As a result, adhesion to the glass layer formed as an insulating layer on either the surface of the nickel-plating layer of the nickel-plated metal sheet or the surface of the nickel-based sheet may be improved remarkably. When it is employed for a substrate for flexible device, it can exhibit a sufficient flexibility to prevent peeling or the like of the glass layer even if being subjected to a roll-to-roll process.

Further, since the oxide layer surface is roughened, the glass layer can be prevented from spreading during formation of the glass layer, and thus, occurrence of cissing on the surface of the glass layer can be prevented or controlled effectively.

Further, according to the method for producing the sheet which is used for substrate for flexible device of the present invention, either the nickel-plated metal sheet or the nickel-based sheet is baked in an oxygen-containing atmosphere, so that an oxide layer having the aforementioned functions can be formed on either the surface of the nickel-plating layer or the surface of the nickel-based sheet. As a result, an oxide layer having a roughened surface to allow formation of a glass layer free from surface defects can be produced easily and continuously, which is favorable from the viewpoint of productivity and economy.

The bismuth-based lead-free glass composition of the present invention has a glass composition that is lead-free and excellent from an environmental viewpoint and it is difficult to crystalize, therefore from which a glass layer with excellent surface smoothness where occurrence of seeding and cissing is prevented or controlled thereon can be formed.

In addition, the composition has excellent adhesion to a metal sheet and can prevent occurrence of seeding and cissing even in a state of a thin layer. Therefore, it can be used favorably as a substrate like a substrate for flexible device for organic EL.

Furthermore, the bismuth-based lead-free glass composition of the present invention has a dense structure to completely prevent moisture permeation, and thus, it can exhibit excellent moisture barrier properties when used for an insulating layer in an electronic device using a metal substrate.

BRIEF DESCRIPTION OF THE DRAWINGS

FIG. 6A shows Substrate No. 1 which is a nickel-plated steel sheet surface (calcined in the air at 750° C. for 15 sec.); FIG. 6B shows Substrate No. 2 which is a nickel-plated steel sheet surface (calcined in the air at 790° C. for 15 sec.); FIG. 6C shows Substrate No. 6 which is a nickel-plated steel sheet surface (calcined in the air at 650° C. for 15 sec.); FIG. 6D shows Substrate No. 10 which is a nickel-plated steel sheet surface (calcined in NH at 750° C. for 15 sec.)

FIG. 7A is a TEM photograph of the nickel-plating layer/glass layer interface of Example 12 (calcined in the air at 770° C. for 20 sec.); and FIG. 7B is a TEM photograph of the nickel-plating layer/glass layer interface of Comparative Example 1 (no calcination).

MODE FOR CARRYING OUT THE INVENTION (Sheet which is Used for Substrate for Flexible Device)

The sheet which is used for substrate for flexible device of the present invention is either a nickel-plated metal sheet prepared by forming a nickel-plating layer on at least one surface of a metal sheet, or a nickel-based sheet. An essential feature of the sheet is that an oxide layer having a roughened surface is formed on either a surface of the nickel-plating layer or a surface of the nickel-based sheet.

Figure 1:
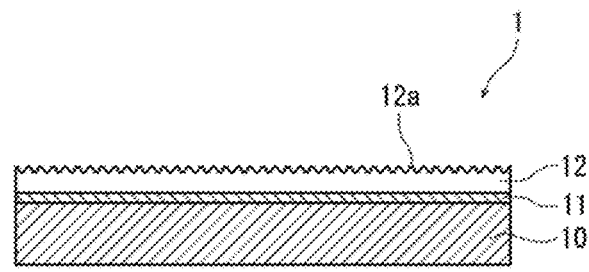
FIG. 1 is a view for showing a cross-sectional structure of an example of a sheet which is used for substrate for flexible device of the present invention.

FIG. 1 is a view showing a cross-sectional structure of a sheet which is used for substrate for flexible device of the present invention, where a nickel-plated metal sheet prepared by forming a nickel-plating layer 11 on a surface of a metal sheet 10 is used. An oxide layer 12 is formed on a surface of the nickel-plating layer 11, and a surface of this oxide layer 12 has roughness 12a.

[Metal Sheet]

On the metal sheet used for the sheet which is used for substrate for flexible device, the nickel-plating layer is formed. Examples of the metal used for the sheet include: iron, stainless steel, titanium, aluminum, copper and the like, though the present invention is not limited to these examples. It is preferable to use a substance having a thermal expansion coefficient in a range of $8\times10^{-6}$ to $25\times10^{-6}/°$ C., in particular in a range of $10\times10^{-6}$ to $20\times10^{-6}/°$ C.

Alternatively in the present invention, it is possible to prepare a metal sheet of a nickel-based sheet, namely a pure nickel sheet or a nickel alloy sheet, without forming a nickel-plating layer. Examples of metal that can make alloy with nickel in the nickel alloy sheet include iron (Fe), copper (Cu) and chromium (Cr).

The metal sheet or the nickel-based sheet preferably has a thickness in a range of 10 to 200 μm, in particular 20 to 100 μm, thereby to obtain sufficient flexibility.

[Nickel-Plating Layer]

In the sheet which is used for substrate for flexible device of the present invention, the nickel-plating layer formed on the metal sheet surface is a layer formed by nickel plating, and the plating may be electrolytic plating or electroless plating as described below. Though the nickel-plating layer is formed on only one surface of the metal sheet in the example shown in FIG. 1, it may be formed on both surfaces of the metal sheet.

Preferably, the nickel-plating layer has a thickness in a range of 0.1 to 10 μm, and in particular 0.5 to 5 μm when the value includes the thickness of the oxide layer. When the thickness of the nickel-plating layer is less than the range, adhesion of the glass layer may be inferior in comparison with the case where the thickness is within the range. Even when the thickness of the nickel-plating layer is greater than the range, further improvement in the effect cannot be expected, and the sheet may be inferior from the economic viewpoint.

The nickel-plating layer may have an alloy layer on the interface with the metal sheet.

[Oxide Layer]

As mentioned above, an essential feature of the present invention is that an oxide layer having a roughened surface is formed on the surface of either the nickel-plating layer or the nickel-based sheet. As a result of reaction between this oxide and the glass, an adhesive layer is formed to improve adhesion of the glass layer. Due to this reason, the metallic nickel present on the surface of either the nickel-plating layer or the nickel-based sheet is preferably not more than 20 atomic %, and in particular not more than 18 atomic %.

The oxide layer comprises at least nickel oxide formed by baking the surface of either nickel-plating layer or the nickel-based sheet in the oxygen-containing atmosphere as mentioned below. Alternatively, it may comprise a nickel oxide and an oxide of a metal diffused from the metal sheet.

Namely, in a case of using a steel sheet for the metal material or using a nickel-iron alloy sheet for the nickel-based sheet, iron is preferably present on the surface of the nickel-plating layer or the nickel-based sheet. Since the iron on the surface is present as an oxide, it can further improve the adhesion of the glass layer by synergy with the nickel oxide, the metallic iron of the irons present on the surface layer of the nickel-plating layer or the surface layer of the nickel-based sheet is preferably not more than 3 atomic %.

It is preferable that the percentage of oxygen on either the surface layer of the nickel-plating layer or the surface layer of the nickel-based sheet is not less than 30 atomic %, in particular in a range of 35 to 50 atomic %, thereby forming an oxide layer with excellent adhesion to the glass layer.

In a case of forming the glass layer on the surface of either the nickel-plating layer or the nickel-based sheet, the oxygen amount on the interface between the glass layer and either the nickel-plating layer or the nickel-based sheet (hereinafter, this may be called "(nickel-plating layer/glass layer) interface") is preferably not less than 80%, and in particular, in a range of 85 to 100% when the oxygen amount on a freely-selected plane (hereinafter, it may be called "glass layer interior") in the thickness direction of the glass layer mentioned below is 100%. That is, since either the nickel-plating layer or the nickel-based sheet on the interface with the glass layer has an oxygen amount approximate to the amount of oxygen present in the glass layer, the surface is considered as being under an anchoring effect from the glass layer. As evidently shown from the results in Examples mentioned below, the interlayer adhesion on the interface is remarkably improved. Here, the freely-selected plane in the thickness direction of the glass layer indicates a freely-selected plane in the thickness direction of the glass layer having a substantially same composition on any plane, with substantially no external influence except for the vicinity of the surface to form the underlying layer as mentioned below or the vicinity of the interface with either the nickel-plating layer or the nickel-based sheet.

In the present invention, protrusions that are presumed as crystal grains are formed on the surface of the oxide layer so as to form roughness (roughened surface), thereby preventing the glass composition from spreading during formation of the glass layer so as to effectively prevent or control occurrence of cissing.

It is preferable that the roughness on the oxide layer surface (surface roughness) is provided so that the arithmetic mean roughness (Ra) is in a range of 30 to 100 nm, and in particular in a range of 50 to 90 nm, and the maximum height roughness (Rz) is in a range of 420 to 900 nm, and in particular in a range of 600 to 850 nm.

Further, the oxide layer has a thickness in a range of 40 to 1200 nm, preferably 500 to 1000 nm, and more preferably 500 to 900 nm. When the oxide layer has a thickness less than the range, the surface modification of the nickel-plating layer or the nickel-based sheet may be insufficient when compared to a case where the thickness is within the range. When the oxide layer has a thickness of more than the range, the surface layer of the nickel-plating layer or the surface layer of the nickel-based sheet may be alloyed further in comparison with the case where the thickness is within the range, and it may weaken the surface layer of the nickel-plating layer or the surface layer of the nickel-based sheet, thereby causing peeling of the surface layer of the nickel-plating layer or the surface layer of the nickel-based sheet.
(Method for Producing Sheet which is Used for Substrate for Flexible Device)

A sheet which is used for substrate for flexible device of the present invention can be produced by a production method comprising an oxide layer forming step of baking in an oxygen-containing atmosphere either a nickel-plated metal sheet prepared by forming a nickel-plating layer on at least one surface of a metal sheet or a nickel-based sheet, thereby forming an oxide layer on a surface of the nickel-plated metal sheet or a surface of the nickel-based sheet.

[Step for Forming Nickel-Plating Layer]

The formation of a nickel-plating layer on a nickel-plated metal sheet for the substrate for flexible device of the present invention can be conducted by any conventional method.

For the step of forming a nickel-plating layer, the procedures may vary depending on the metal sheet in use. When a steel sheet is used for the metal sheet, prior to the plating, the sheet is degreased by alkaline electrolysis or the like, washed in water, and then subjected to a conventionally-known pre-treatment such as acid pickling by immersion in sulfuric acid or the like.

The pre-treated metal sheet is plated as described above in any conventionally-known methods such as electrolytic plating and electroless plating, so that the nickel-plating layer can be formed. The electrolytic plating is preferred from the viewpoint of consecutive productivity. For the nickel plating bath, any bathing widely used such as watt bath and sulfamic acid bath can be used under known electrolysis conditions in accordance with known formulation. As mentioned above, the nickel-plating layer is preferably formed to have a thickness in a range of 0.1 to 10 µm, and in particular 0.5 to 5 µm.

[Step for Forming Oxide Layer]

In the method for producing the sheet which is used for substrate for flexible device of the present invention, it is important to form a roughened oxide layer on the surface of the nickel-plating layer or the surface of the nickel-based sheet by baking the surface of the nickel-based sheet or the surface of the nickel-plating layer on the nickel-plated metal sheet in the oxygen-containing atmosphere.

The conditions for baking are not limited particularly as long as the aforementioned oxide layer can be formed, but preferably, the temperature for baking is in a range of 550 to 900° C., and in particular 750 to 850° C. The baking time can be modified suitably depending on the oxygen concentration and baking temperature of the oxygen-containing atmosphere. In a case of baking in air within the aforementioned temperature range, it is preferable to bake for 5 to 120 seconds at the baking temperature. As mentioned above, the oxide layer is formed to have a thickness in a range of 40 to 1200 nm, preferably in a range of 500 to 1000 nm, and more preferably in a range of 500 to 900 nm.

Depending on the conditions for baking, an alloy layer may be formed on the surface of the nickel-plating layer or the nickel-based sheet as a result of baking for oxide layer formation during the step.

[Others]

As mentioned above, the sheet which is used for substrate for flexible device of the present invention can be used preferably as the sheet for the substrate for flexible device having a glass layer as an insulating layer.

In the sheet which is used for substrate for flexible device of the present invention, for the glass layer that can be formed on the oxide layer having a roughened surface, any glass layer conventionally used as a transparent substrate or an insulating layer for an organic EL lighting or the like can be used without any particular limitations. For example, low melting point glass such as tin-phosphate-based glass, bismuth-based glass, vanadium-based glass, lead-based glass and the like can be used though the present invention is not limited to these examples. Among them, the bismuth-based glass can be coated preferably since it has excellent moisture barrier properties and also excellent adhesion to the metal sheet.

For the bismuth-based glass, electrically insulating bismuth-based glass having a softening point of 300 to 500° C. is preferred, and glass having a composition containing $Bi_2O_3$ as its main component (in particular, not less than 70% by weight) is particularly preferred.

In a case of forming a substrate for flexible device by use of the sheet which is used for substrate for flexible device of the present invention, the glass layer is formed by firing a glass frit having an average particle diameter of not more than 20 µm, preferably in a range of 1 to 10 µm. In a case of using bismuth-based glass, formation of the glass of the glass layer is conducted under conditions of temperature of 430° C. or higher and lower than 900° C. and time in a range of 10 seconds to 30 minutes.

The glass layer formed on the sheet which is used for substrate for flexible device of the present invention is smooth with a surface roughness (Ra) of not more than 10 nm, and it may be free from surface defects like cissing.

(Substrate for Flexible Device)

The substrate for flexible device of the present invention is a substrate for flexible device comprising either a nickel-plated metal sheet prepared by forming a nickel-plating layer on at least one surface of a metal sheet or a nickel-based sheet, and a glass layer as electrically-insulating layered bismuth-based glass formed on either the nickel-plating layer or the nickel-based sheet. Essential features thereof are as follows. An oxide layer having a roughened surface is formed on the surface of the nickel-plating layer or the surface of the nickel-based sheet, and the bismuth-based glass contains 70 to 84% by weight of $Bi_2O_3$, 10 to 12% by weight of ZnO, and 6 to 12% by weight of $B_2O_3$.

The substrate for flexible device of the present invention is prepared by forming a glass layer as an insulating layer consisting of a bismuth-based glass composition containing $Bi_2O_3$, ZnO and $B_2O_3$ on the oxide layer having a roughened surface and formed on the aforementioned nickel-plating layer on the sheet which is used for substrate for flexible device or the nickel-based sheet.

Figure 2:
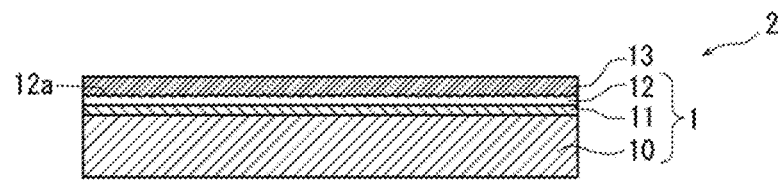
FIG. 2 is a view showing a cross-sectional structure of an example of a substrate for flexible device of the present invention.

FIG. 2 shows an example of a cross-sectional structure of a substrate for flexible device 2 of the present invention, where a nickel-plated metal sheet (the sheet which is used for substrate for flexible device 1 shown in FIG. 1) prepared by forming a nickel-plating layer 11 on the surface of the metal sheet 10 is used. A glass layer 13 is formed on the surface of the nickel-plating layer 11, and the surface of the oxide layer 12 formed on the surface of the nickel-plating layer 11 is provided with roughness 12a.

[Glass Layer]

It has been known that bismuth-based glass has excellent moisture barrier properties and excellent adhesion to a metal sheet. The bismuth-based glass of the present invention contains $Bi_2O_3$ as the main component and also ZnO and $B_2O_3$ as essential components where these components are blended at around the eutectic point, thereby forming a glass network structure that will be difficult to crystalize. As a result of synergy with the aforementioned combination with the nickel-plating layer, it is possible to provide a substrate for flexible device where occurrence of cissing on the glass surface may be prevented or controlled effectively.

It is important that the bismuth-based glass contains 70 to 84% by weight of $Bi_2O_3$, 10 to 12% by weight of ZnO, and 6 to 12% by weight of $B_2O_3$. Since the contents of these components are within these ranges, crystallization of glass is prevented or controlled, and occurrence of cissing may be prevented or controlled effectively.

It is preferable that the bismuth-based glass used for the substrate for flexible device of the present invention contains further $SiO_2$ and/or $Al_2O_3$ in addition to the essential components, and the content of $SiO_2$ is 0 to 2% by weight and the content of $Al_2O_3$ is 0 to 1% by weight (where at least either $SiO_2$ and/or $Al_2O_3$ of more than 0% by weight is contained). By blending at least one of these components, the durability is improved so that the glass layer can be stabilized.

It is preferable that the bismuth-based glass used for the substrate for flexible device of the present invention contains further CuO and/or NiO in addition to the essential components, and the content of CuO is 0 to 2% by weight and the content of NiO is 0 to 2% by weight (where at least either CuO and/or NiO of more than 0% by weight is contained). By blending at least one of these components, the adhesion to the nickel-plating layer is improved further so that cissing prevention effect may be improved further.

Moreover, it is preferable that the bismuth-based glass used for the substrate for flexible device of the present invention further contains more than zero and not more than 1.5% by weight of any of $Y_2O_3$, $ZrO_2$, $La_2O_3$, $CeO_2$, $TiO_2$, CoO and $Fe_2O_3$ in addition to the essential components, so that the durability of the glass can be improved and the substrate for flexible device can be prevented effectively from warping. These components can be used in combination with each other. In that case, preferably, the total amount is not more than 1.5% by weight.

It is preferable that the glass layer of the substrate for flexible device of the present invention has a thickness in a range of 2 to 45 μm. When the thickness of the glass layer is less than the range, the roughness caused by the oxide layer cannot be smoothened sufficiently in comparison with the case where the thickness is within the range. When the thickness is greater than the range, the flexibility may be inferior in comparison with the case where the thickness is within the range.

[Underlying Layer for Formation of Electrode Layer]

Figure 3:
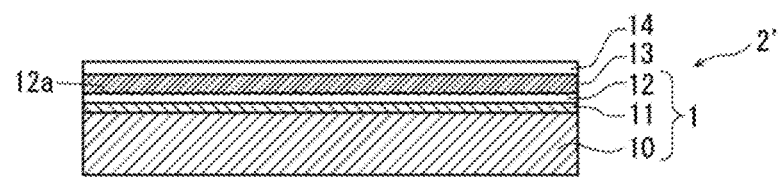
FIG. 3 is a view showing a cross-sectional structure of another example of a substrate for flexible device of the present invention.

In the substrate for flexible device of the present invention, it is possible to form an electrode layer such as an anode or cathode directly on the glass layer surface. As shown in FIG. 3, an underlying layer 14 is formed on the surface of the glass layer 13 preferably from the viewpoint of adhesion of the electrode layer. The underlying layer 14 comprises nickel (Ni), indium tin oxide (ITO), silver (Ag), gold (Au), copper (Cu), magnesium-silver (MgAg), gold-copper (AuCu), silver-copper (AgCu), zinc oxide (ZnO), cobalt (Co), palladium (Pd) and the like.

This underlying layer can exhibit excellent adhesion to every electrode layer used for an organic EL substrate, comprising aluminum (Al), silver (Ag), gold (Au), an alloy thereof or the like. In a case of forming an electrode layer comprising aluminum (Al) or silver (Ag), the underlying layer comprises particularly preferably nickel or indium tin oxide among the metals or metal oxides.

The underlying layer preferably has a thickness in a range of 5 to 100 nm. When the thickness is less than the range, it may be difficult to improve the adhesion of the electrode layer sufficiently. Even when the layer is made thicker than the range, any further improvement in the adhesion cannot be expected, but it may only cause disadvantages from an economic viewpoint.

Since this underlying layer has excellent adhesion to all types of electrically insulating bismuth-based glass used for the substrate for flexible device, application of the underlying layer is not limited to the case of using the aforementioned specific bismuth-based glass. This underlying layer can be used preferably also for a case where an electrode layer is formed on any substrate for flexible device.

(Method for Producing Substrate for Flexible Device)

The substrate for flexible device of the present invention can be produced by a production method including a step of forming an oxide layer, and a step of forming a glass layer. In the step of forming an oxide layer, either a nickel-plated metal sheet prepared by forming a nickel-plating layer on at least one surface of a metal sheet or a nickel-based sheet is baked in an oxygen-containing atmosphere such that the oxide layer is formed on either the surface of the nickel-plating layer or on the surface of the nickel-based sheet. In the process of forming a glass layer, a bismuth-based glass layer containing $Bi_2O_3$, ZnO and $B_2O_3$ is formed on the oxide layer.

That is, the substrate for flexible device of the present invention is formed through the step of forming a nickel-plating layer, the step of forming an oxide layer, and then a step of forming a glass layer as mentioned below, in the method for producing the sheet which is used for substrate for flexible device.

This method can include further a step of forming an underlying layer on the glass layer in order to form an electrode layer comprising nickel, indium tin oxide or the like, subsequent to the step of forming the glass layer.

[Step of Forming Glass Layer]

On the nickel-plating layer provided with an oxide layer formed thereon by the aforementioned step of forming an oxide layer, a bismuth-based glass layer containing $Bi_2O_3$, ZnO and $B_2O_3$ is formed.

In the step of forming a glass layer, usually a glass powder and a vehicle are mixed and dispersed to prepare glass paste, which is coated and dried on the oxide layer on the surface of the nickel-plating layer, and fired, though the procedures are not limited to this example.

<Preparation of Glass Paste>

The glass powder used for the glass layer formation is a glass frit containing $Bi_2O_3$, ZnO and $B_2O_3$ as its basic components. Specifically, as mentioned above, the content of $Bi_2O_3$ is 70 to 84% by weight, the content of ZnO is 10 to 12% by weight, and the content of $B_2O_3$ is 6 to 12% by weight.

Furthermore, as mentioned above, it is preferable that the glass composition contains further $SiO_2$ and/or $Al_2O_3$, CuO and/or NiO, and any of $Y_2O_3$, $ZrO_2$, $La_2O_3$, $CeO_2$, $TiO_2$, CoO and $Fe_2O_3$ in addition to the essential components described above. Specifically, from the viewpoint of stability of the glass, $SiO_2$ is contained in an amount of 0 to 2% by weight, and $Al_2O_3$ is contained in an amount of 0 to 1% by weight; from the viewpoint of improving adhesion to the nickel-plating layer, CuO is contained in an amount of 0 to 2% by weight, and NiO is contained in an amount of 0 to 2% by weight; and, from the viewpoint of preventing the substrate from warping after firing, any of $Y_2O_3$, $ZrO_2$, $La_2O_3$, $CeO_2$, $TiO_2$, CoO and $Fe_2O_3$ is contained in an amount of not more than 1.5% by weight.

It is preferable that the glass composition has a softening point within a range of 300 to 500° C. Bismuth-based glass that is softened at a temperature lower than this range may easily be crystalized during firing in comparison with the glass having a softening point within this range. Moreover, in a case where there is a necessity of debinding, the glass may be softened at a temperature for the debinding treatment. As a result, the decomposed gas of the binder may enter the glass to cause pinholes. When the softening point is higher than the range, a higher temperature is required in comparison with the case where the softening temperature is within the range, which may cause deformation or degradation of the substrate itself to hinder film formation. When firing is conducted at a relatively low temperature, the glass melts insufficiently, whereby the surface smoothness may deteriorate.

The glass powder is obtained by mixing the glass compositions, heating at a temperature in a range of 800 to 1200° C. to form molten glass, quenching to obtain a glass frit, and then, pulverizing by JET pulverization or the like. For obtaining a smooth glass plane, it is preferable to pulverize the glass such that the average particle diameter is not more than 20 µm, preferably in a range of 1 to 10 µm, and more preferably 1 to 5 µm. In the present invention, the average particle diameter of the glass powder is obtained as a measurement value by a laser diffraction-scattering method.

A glass paste is obtained by mixing and dispersing the glass powder and the vehicle homogeneously by using a bead mill, a paint shaker, a roll or the like. Alternatively, from the viewpoint of dispersion, it can be prepared as a dispersion liquid.

For the vehicle, any conventionally known solvent-based or aqueous vehicles can be used, and the examples include the following organic binders and solvents, though the present invention is not limited to these examples.

Examples of the organic binder include: cellulose-based resins such as methyl cellulose, ethyl cellulose, carboxymethyl cellulose, oxyethyl cellulose, benzyl cellulose, propyl cellulose, and nitrocellulose; organic resins like an acrylic resin obtained by polymerizing at least one acrylic monomer, such as methyl methacrylate, ethyl methacrylate, butyl methacrylate, 2-hydroxyethyl methacrylate, butyl acrylate, and 2-hydroxyethyl acrylate; and aliphatic polyolefin-based carbonate resins such as polypropylene carbonate, though the present invention is not limited to the examples.

The solvent may be selected suitably according to the organic binder in use. The examples include: water, terpineol, butyl carbitol acetate, ethyl carbitol acetate and the like for the cellulose-based resins; methyl ethyl ketone, terpineol, butyl carbitol acetate, ethyl carbitol acetate or the like for the acrylic resins; and propylene carbonate, triacetin or the like for the aliphatic polyolefin-based carbonate, though the present invention is not limited to the examples.

Known thickeners, dispersants and the like may be added to the glass paste according to a known formulation, if necessary.

<Coating, Drying and Firing of Glass Paste>

The thus prepared glass paste is coated on the nickel-plating layer by a coating method suitable for the viscosity of the glass paste. The coating can be conducted by using a bar coater, a die coater, a roll coater, a gravure coater, screen printing or the like though the present invention is not limited to the examples. Preferably, the thus formed glass layer has a thickness of 2 to 45 µm.

The coated glass paste is dried at a temperature in a range of 80 to 180° C. After drying, a debinding treatment is conducted as required. Preferably, the debinding treatment is conducted by heating for 10 minutes or more at a temperature in a range of 180 to 450° C.

After drying, the coated plane that has been subjected to the debinding treatment as required is fired for 10 to 300 seconds at a temperature of 550 to 900° C., preferably 650 to 850° C. When the firing temperature is lower than this range, melting may be insufficient in comparison with the case where the temperature is within the range. When the firing temperature is higher than the range, the nickel-plating layer may be affected in comparison with the case where the temperature is within the range.

[Step of Forming Underlying Layer]

In the substrate for flexible device of the present invention, it is possible to form an electrode layer directly on the glass layer. However, as mentioned above, it is preferable that an underlying layer is formed and the electrode layer is formed on the underlying layer.

The underlying layer can be made from a metal or a metal oxide such as nickel and indium tin oxide, by any conventionally known method such as sputtering, vapor deposition, and CVD. Among the film-formation methods, sputtering is particularly preferred.

There is no particular limitation for the conditions of sputtering, but the sputtering can be conducted under any conventionally known conditions as long as an underlying layer having a thickness in a range of 5 to 100 nm can be formed. It is also preferable to purify the glass layer surface by a conventionally known cleaning and drying method before formation of the underlying layer.

(Substrate for Organic EL Device)

Figure 4:
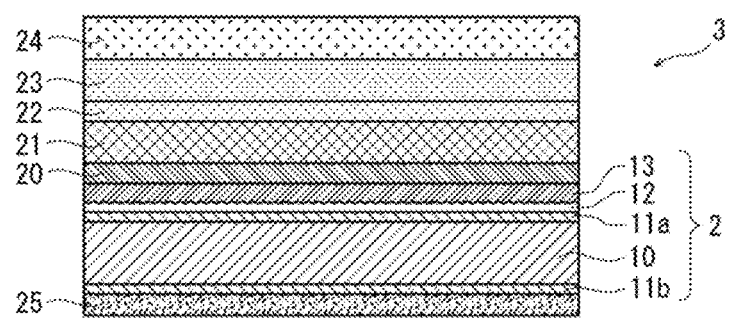
FIG. 4 is a view for showing a cross-sectional structure of a substrate for an organic EL device using the substrate for flexible device shown in FIG. 2.

FIG. 4 is a view showing a cross-sectional structure of one example of a substrate for organic EL device, where the substrate for flexible device of the present invention as shown in FIG. 2 is used.

A substrate 2 for flexible device comprises a metal sheet 10 and nickel-plating layers 11a, 11b formed on both surfaces of the metal sheet 10. On the surface of the nickel-plating layer 11a, an oxide layer 12 having a roughened surface is formed, and a glass layer 13 is formed on this oxide layer 12.

A substrate 3 for organic EL device comprises at least an electrode layer (Ag, Al) 20 formed on the glass layer 13 of the substrate for flexible device, an organic thin film light-emitting layer 21 formed on the electrode layer 20, and a transparent electrode layer 22 formed on the organic thin film light-emitting layer 21. In the specific example shown in FIG. 4, a transparent sealing layer 23 and a transparent sealing member 24 are further laminated on the transparent electrode layer 22, and a corrosion-resistant layer 25 is formed on the nickel-plating layer 11b.

Figure 5:
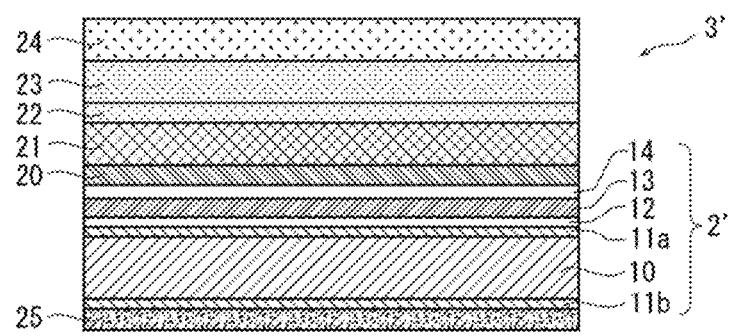
FIG. 5 is a view for showing a cross-sectional structure of a substrate for an organic EL device using the substrate for flexible device shown in FIG. 3.

Further, FIG. 5 is a view showing a cross-sectional structure of a substrate 3' for organic EL device formed with a substrate 2' for flexible device comprising an underlying layer 14 formed on the glass layer 13 shown in FIG. 3.

(Bismuth-Based Lead-Free Glass Composition)

An essential feature of the bismuth-based lead-free glass composition of the present invention is that it contains 70 to 84% by weight of $Bi_2O_3$, 10 to 12% by weight of ZnO and 6 to 12% by weight of $B_2O_3$. Since these components are contained within the ranges and around the range of eutectic point, glass that is difficult to crystallize is formed.

In the present invention, $Bi_2O_3$ is the main component to lower the viscosity of glass, and preferably it is contained in an amount of 70 to 84% by weight, and particularly 75 to 82% by weight. When the content of $Bi_2O_3$ is smaller than the range, the softening point becomes high and the viscosity is increased excessively. When the content is larger than the range, crystallization may be accelerated to cause seeding or cissing.

ZnO is a component for stabilizing the glass and preventing devitrification during melting of the glass, and preferably it is contained in an amount of 10 to 12% by weight, and particularly 10.5 to 11% by weight. When the content of ZnO is smaller than the range, durability of the glass may deteriorate and at the same time, devitrification may easily occur. In addition, the glass transition temperature may rise, so that smoothness of the fired glass may deteriorate. When the ZnO content is larger than the range, crystallization may be accelerated to cause seeding and/or cissing, and at the same time, the durability may deteriorate.

$B_2O_3$ is a component for forming a glass network, and preferably it is contained in an amount of 6 to 12% by weight, and particularly 6 to 7% by weight. When the content of $B_2O_3$ is smaller than the range, the glass may be unstable and its durability may deteriorate. In addition, the glass may be crystallized easily during firing, thereby to cause seeding and/or cissing. When the $B_2O_3$ content is larger than the range, the water resistance may deteriorate.

Preferably, the glass composition of the present invention contains $SiO_2$ and/or $Al_2O_3$ in addition to the essential components.

$SiO_2$ forms a glass network together with $B_2O_3$ so that the glass can be stabilized further. Preferably, the content of $SiO_2$ is not more than 2% by weight, and particularly in a range of 1.2 to 1.5% by weight. When the $SiO_2$ content is larger than the range, the melting properties of the glass may deteriorate in comparison with a case of blending the component within the aforementioned range.

Further, blending $Al_2O_3$ makes it possible to further stabilize the glass. The amount of $Al_2O_3$ to be blended is preferably not more than 1% by weight, and particularly preferably in a range of 0.4 to 0.6% by weight. When the amount of $Al_2O_3$ to be blended is greater than the above range, the melting properties of the glass may deteriorate in comparison with a case of blend amount within the range.

It is preferable that the glass composition of the present invention further contains CuO and/or NiO in addition to the aforementioned essential components.

By blending CuO in an amount of not more than 2% by weight, and in particular in an amount of 1.3 to 1.6% by weight, the melting properties of glass may be improved. When the amount of CuO to be blended is greater than the range, adhesion to the metal sheet may deteriorate.

Further, by blending NiO in an amount of not more than 2% by weight, in particular in a range of 1.3 to 1.6% by weight, the melting properties of the glass may be improved similarly to the case of blending CuO. When the amount of NiO to be blended is greater than the range, adhesion to the metal sheet may deteriorate.

Preferably, the glass composition of the present invention further contains any of $Y_2O_3$, $ZrO_2$, $La_2O_3$, $CeO_2$, $TiO_2$, CoO and $Fe_2O_3$ in an amount of not more than 1.5% by weight in addition to the aforementioned essential components.

When any of $Y_2O_3$, $ZrO_2$, $La_2O_3$, $CeO_2$, $TiO_2$, CoO and $Fe_2O_3$ is contained in the amount, glass durability can be improved. However, when the blend amount of these components exceeds the range, the durability of the glass may rather deteriorate. These components can be used also as a combination of plural components. In that case, the total amount is preferably not more than 1.5% by weight.

[Bismuth-Based Lead-Free Glass Composition Paste]

A bismuth-based lead-free glass composition paste of the present invention comprises the aforementioned glass composition powder and the vehicle, and an essential feature thereof is that the average particle diameter of the glass composition powder is not more than 20 μm.

The vehicle that constitutes the paste together with the glass composition powder is used to adjust the viscosity of the paste, and it is prepared by dissolving an organic binder in a solvent.

It is preferable that the glass composition paste contains 30 to 80% by weight of the aforementioned glass composition powder, more than 0 and not more than 10% by weight of an organic binder, and 10 to 70% by weight of a solvent. When the amount of the glass composition powder is less than the range, the paste viscosity is lowered to make it difficult to form a glass layer of a desired thickness. When the amount of the glass composition powder exceeds the range, the paste viscosity may be increased excessively to degrade the coatability. When the amount of the organic binder is smaller than the range, the coatability may deteriorate. When the amount of the organic binder is greater than the range, a non-fired residue may remain after firing. Further, when the amount of the solvent is less than the range, the paste viscosity is increased excessively to degrade the coatability. When the amount of the solvent is greater than the range, the paste viscosity is lowered excessively to make it difficult to form a glass layer of a desired thickness.

Examples of the organic binder include: cellulose-based resins such as methyl cellulose, ethyl cellulose, carboxymethyl cellulose, oxyethyl cellulose, benzyl cellulose, propyl cellulose, and nitrocellulose; organic resins such as an acrylic resin obtained by polymerizing one or more types of acrylic monomers, such as methyl methacrylate, ethyl methacrylate, butyl methacrylate, 2-hydroxyethyl methacrylate, butyl acrylate, and 2-hydroxyethyl acrylate; and aliphatic polyolefin-based carbonate resins such as polypropylene carbonate, though the present invention is not limited to these examples.

The solvent may be selected suitably depending on the organic binder in use, and the examples include: water, terpineol, butyl carbitol acetate, and ethyl carbitol acetate for a cellulose-based resin; methyl ethyl ketone, terpineol, butyl carbitol acetate, and ethyl carbitol acetate for an acrylic resin; and propylene carbonate and triacetin for aliphatic polyolefin-based carbonate, though the present invention is not limited to these examples.

The glass composition paste is obtained by mixing a glass composition powder and a vehicle, and dispersing the mixture. Here, the glass composition powder is obtained by pulverizing a glass frit comprising the aforementioned bismuth-based lead-free glass composition.

Specifically, the glass composition powder is obtained by mixing the aforementioned glass composition, heating the mixture at a temperature of 800 to 1200° C. and quenching to obtain a glass frit, then pulverizing the frit. Methods for pulverizing include conventionally known methods such as JET pulverization, rapid mill grinding, and ball mill grinding.

In the present invention, it is important that the glass composition powder has an average particle diameter of not more than 20 μm, preferably in a range of 1 to 10 μm, and more preferably 1 to 5 μm, so as to obtain a smooth glass surface. In order to obtain such a fine powder, the JET pulverization is preferred among the pulverizing methods.

In the present invention, the average particle diameter of the glass composition powder is a value measured by a laser diffraction-scattering method.

Then, the obtained glass composition powder having an average particle diameter of not more than 20 μm is mixed with vehicle and dispersed.

Examples of the method for mixing and dispersing include dispersion by use of a rotary mixer equipped with stirring blades, a bead mill, a paint shaker, a roll mill, an agate mortar, and ultrasonic waves. Preferably, mixing and dispersing is carried out using a bead mill, a paint shaker or a roll mill.

Any known thickener, dispersant or the like can be added to the glass composition paste according to known formalities as required.

[Formation of Glass Layer]

The glass composition paste of the present invention can be coated not only on the aforementioned sheet which is used for substrate for flexible device of the present invention but any other substrates such as a glass substrate, a ceramic substrate, an aluminum substrate, a stainless steel substrate, a steel substrate and various steel substrates plated with Ni and the like, and a titanium substrate, by using a bar coater, a die coater, a roll coater, a gravure coater, screen printing, offset printing, and an applicator, for instance.

The coated glass paste is dried at a temperature of 80 to 180° C. After being dried, it may be subjected to a debinding treatment as required. It is preferable that heating is carried out in the debinding treatment at a temperature of 180 to 450° C. for 10 minutes or longer.

After drying, the coated plane that has been subjected to the debinding treatment as required is fired at a temperature of 550 to 900° C., preferably 650 to 850° C. for 10 to 300 seconds so as to form a glass layer. If the firing temperature is lower than the aforementioned range, melting may be insufficient in comparison with a case where the firing temperature is within the range. If the firing temperature is higher than the range, the substrate may be affected in comparison with a case where the firing temperature is within the range.

Preferably, the glass composition of the present invention has its softening point within a range of 300 to 500° C. Bismuth-based glass that may be softened at a temperature lower than the range may be easily crystallized during firing in comparison with bismuth-based glass having its softening point within the range. Further, there is a risk that the glass may be softened at debinding temperature in a case where the debinding treatment is required. As a result, the decomposed gas of the binder may enter the glass to cause pinholes. When the softening point is higher than the range, the temperature for firing is required to be higher in comparison with the case where the softening point is within the range. As a result, the substrate itself may be deformed or degraded to hinder film formation. If the firing is conducted at a relatively low temperature, glass melting may be insufficient and the surface smoothness may deteriorate.

EXAMPLES

Experiment A (Sheet Nos. 1 to 11, and No. 15)
1. Nickel-Plated Steel Sheet
[Metal Sheet]

For a metal sheet, a steel sheet obtained by anneal-degreasing a cold-rolled sheet (thickness: 50 µm) of ordinary steel having the chemical composition indicated below was prepared.

The composition includes: C of 0.03% by weight; Si of 0.01% by weight; Mn of 0.25% by weight; P of 0.008% by weight; S of 0.005% by weight; Al of 0.051% by weight; and a balance including Fe and inevitably contained components.

[Formation of Nickel-Plating Layer]

Next, a steel sheet (dimension: 12 cm in length, 10 cm in width, and 50 µm in thickness) was subjected to alkaline electrolytic degreasing and acid pickling by immersion in sulfuric acid, and then nickel-plated under the following condition, so that nickel-plating layers each having a thickness of 1 µm and a surface roughness (Ra) of 30.1 nm were formed on both surfaces of the steel sheet.

Bath composition: nickel sulfate of 300 g/L; nickel chloride of 40 g/L; boric acid of 35 g/L; and pit inhibitor (sodium lauryl sulfate) of 0.4 mL/L pH: 4 to 4.6

Bath temperature: 55° C. to 60° C.

Current density: 25 A/dm$^2$ (Sheet No. 12 to No. 14)
2. Pure Nickel Sheet

For a nickel-based sheet, a pure nickel sheet having a thickness of 100 µm was prepared.

3. Formation of Oxide Layer

Under the conditions indicated in Table 1, the nickel-plated steel sheets of Sheet Nos. 1-3, 5-7 and 15, and the pure nickel sheets of Sheet Nos. 13 and 14 were baked using a thin steel sheet heat treatment simulator (part number CCT-AV supplied by SHINKU-RIKO Inc.). The Sheet No. 4 and No. 12 were not baked for the purpose of comparison. The Sheet Nos. 8 to 11 were baked in an NH atmosphere.

For the baked nickel-plated steel sheets, the nickel-plated steel sheet of Sheet No. 4, the baked pure nickel sheets and the pure nickel sheet of Sheet No. 12, the surface roughness, specifically, the arithmetic mean roughness (Ra) and the maximum height roughness (Rz), and the thickness of the surface oxide were measured. The results are indicated in Table 1.

Figure 6A:
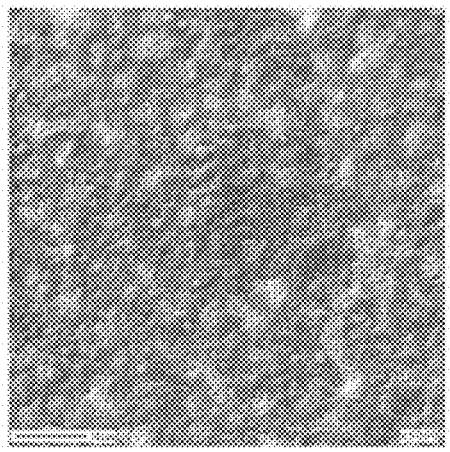
FIGS. 6A-6D are SEM photographs showing surfaces of nickel-plating layers after baking of Sheet No. 1, No. 2, No. 6 and No. 10 of nickel-plated steel sheets in Table 1, and a SEM photograph FIG. 6E showing a surface of a nickel-plating layer of Sheet No. 4. Therein.
Figure 6B:
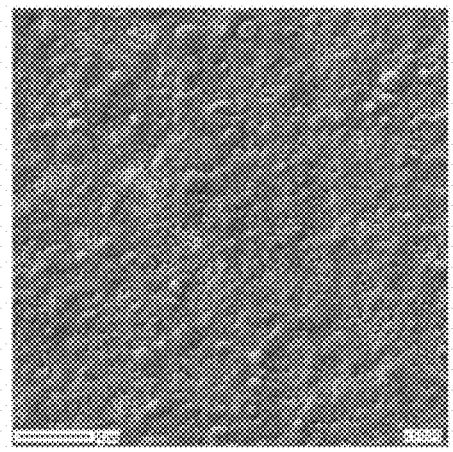
Figure 6C:
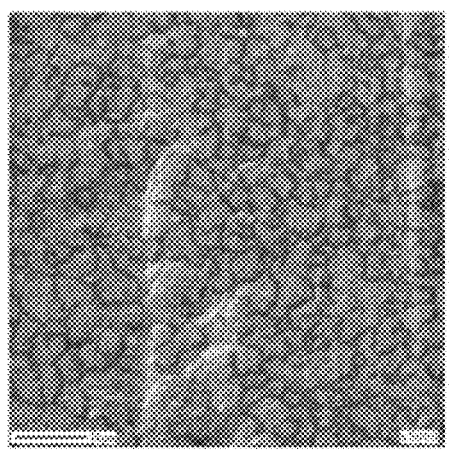
Figure 6D:
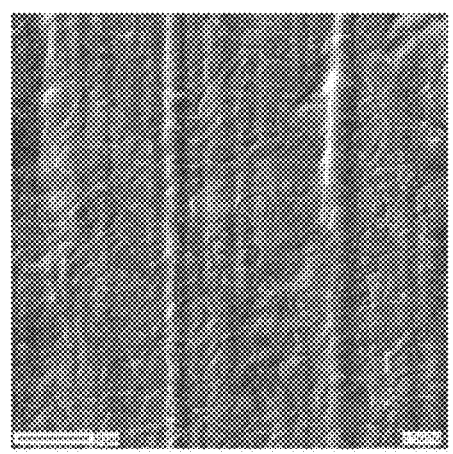
Figure 6E:
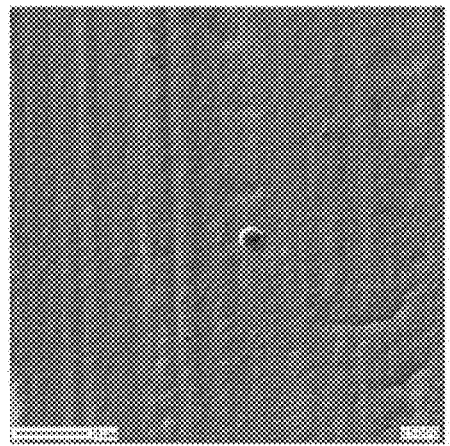
FIG. 6E shows Substrate No. 4 which is a nickel-plated steel sheet surface (no calcination).

FIGS. 6A-6D include SEM photographs showing nickel-plating layer surfaces after baking of Sheet Nos. 1, 2, 6 and 10, and FIG. 6E is a SEM photograph showing a nickel-plating layer surface of Sheet No. 4.

The thickness and the surface roughness (Ra, Rz) of the oxide layer in Table 1 were measured by the following methods.

Arithmetic mean roughness (Ra) and maximum height roughness (Rz) were measured at the SPM measurement mode of a microscope (nano-search microscope with part number OLS3500 supplied by Olympus Corporation) in compliance with JIS B 0601.

Oxide layer thickness was measured using a field emission auger microprobe (AES with part number JAMP-9500F, supplied by JEOL).

TABLE 1

| Sheet No. | Metal sheet | Baking condition | | | Ra (nm) | Rz (nm) | Oxide layer (nm) |
| | | Atmosphere | Temperature (° C.) | Time (sec.) | | | |
|---|---|---|---|---|---|---|---|
| 1 | Nickel-plated steel sheet | Air | 750 | 15 | 52.2 | 690.1 | 500 |
| 2 | Nickel-plated steel sheet | Air | 790 | 15 | 63.4 | 714.3 | 700 |

TABLE 1-continued

| Sheet No. | Metal sheet | Baking condition Atmosphere | Temperature (° C.) | Time (sec.) | Ra (nm) | Rz (nm) | Oxide layer (nm) |
|---|---|---|---|---|---|---|---|
| 3 | Nickel-plated steel sheet | Air | 850 | 15 | 83.5 | 820.2 | 900 |
| 4 | Nickel-plated steel sheet | No baking | | | 30.1 | 491.1 | 10 |
| 5 | Nickel-plated steel sheet | Air | 550 | 15 | 33.8 | 481.5 | 40 |
| 6 | Nickel-plated steel sheet | Air | 650 | 15 | 32.2 | 435.9 | 125 |
| 7 | Nickel-plated steel sheet | Air | 900 | 15 | 100.8 | 763.3 | 1300 |
| 8 | Nickel-plated steel sheet | NH | 550 | 15 | 23.6 | 368.0 | 5 |
| 9 | Nickel-plated steel sheet | NH | 650 | 15 | 25.8 | 416.4 | 5 |
| 10 | Nickel-plated steel sheet | NH | 750 | 15 | 33.4 | 405.9 | 5 |
| 11 | Nickel-plated steel sheet | NH | 850 | 15 | 26.4 | 421.2 | 5 |
| 12 | Pure nickel sheet | No baking | | | 47.8 | 547.7 | 20 |
| 13 | Pure nickel sheet | Air | 650 | 15 | 36.0 | 473.0 | 30 |
| 14 | Pure nickel sheet | Air | 750 | 15 | 51.5 | 612.8 | 153 |
| 15 | Nickel-plated steel sheet | Air | 770 | 20 | 43.3 | 514.0 | 340 |

4. Measurement of Sheet Surface Layer by XPS

For the surface layers of the Sheet Nos. 1, 4, 6, 10 and 11, percentages of carbon, oxygen, iron and nickel (100 atomic % in total), percentage of metallic iron and iron oxide (100 atomic % in total), and percentage of metallic nickel and nickel oxide (100 atomic % in total) were measured using a scanning XPS microprobe (XPS apparatus with part number PHI5000VersaProbe II, supplied by ULVAC-PHI, INCORPORATED). The results are indicated in Table 2.

TABLE 2

| Sheet No. | Percentage of elements present on sheet surface layer (atomic %) | | | | Percentage of elements present on sheet surface layer (atomic %) | | | |
|---|---|---|---|---|---|---|---|---|
| | C | O | Fe | Ni | Metallic Fe | Fe oxide | Metallic Ni | Ni oxide |
| 1 | 3.4 | 45.77 | 23.42 | 27.41 | 1.75 | 98.25 | 5.9 | 94.1 |
| 4 | 0 | 24.77 | 17.61 | 57.62 | 3.71 | 96.29 | 71.9 | 28.1 |
| 6 | 0.8 | 38.1 | 16.25 | 44.85 | 2.73 | 97.27 | 17.03 | 82.97 |
| 10 | 0 | 6.3 | 26.47 | 67.23 | 14.89 | 85.11 | 84.26 | 15.74 |
| 11 | 1.08 | 8.53 | 29.16 | 61.23 | 41.28 | 58.72 | 81.12 | 18.88 |

5. Confirmation of Presence of Iron on Sheet Surface Layer

For the surface layers of Sheet Nos. 1, 4, 6 and Nos. 12 to 14, presence of iron was checked using the scanning XPS microscope. The results are indicated in Table 3.

TABLE 3

| Sheet No. | Presence of Fe element on sheet surface layer |
|---|---|
| 1 | Yes |
| 4 | Yes |
| 6 | Yes |
| 12 | No |
| 13 | No |
| 14 | No |

6. Formation of Glass Layer

In a degreasing step, Sheets Nos. 1 to 15 were used. The surface of each sheet was wiped off with gauze soaked in alcohol for the purpose of degreasing.

In a coating formation step, a vehicle as a mixture of an organic solvent and a binder was prepared. The vehicle was mixed in a mortar with bismuth-based glass frits of the glass composition Nos. A to K described in Table 4 so that the weight ratio would be 25:75. The mixture was dispersed using a ceramic roll to produce a glass paste for coating. Then, the surfaces of the Sheet Nos. 1 to 15 were coated with the coating glass paste by using a bar coater such that the coating film thickness after firing would be 20 μm, whereby a coating was formed.

TABLE 4

| | | Glass composition No. | | | | | | | | | | |
|---|---|---|---|---|---|---|---|---|---|---|---|---|
| | | A | B | C | D | E | F | G | H | I | J | K |
| Component (wt %) | $Bi_2O_3$ | 81.12 | 79.65 | 79.77 | 82.61 | 83.88 | 78.71 | 81.04 | 80.66 | 80.61 | 78.16 | 80.42 |
| | ZnO | 10.89 | 10.70 | 10.70 | 11.08 | 8.75 | 12.18 | 9.30 | 10.84 | 10.85 | 10.50 | 10.81 |
| | $B_2O_3$ | 6.21 | 6.09 | 6.10 | 6.31 | 5.78 | 5.94 | 6.20 | 6.20 | 6.20 | 6.00 | 6.16 |
| | $SiO_2$ | 1.31 | 1.31 | 1.31 | 0.00 | 1.22 | 1.12 | 1.31 | 1.31 | 1.31 | 1.29 | 1.31 |
| | $Al_2O_3$ | 0.47 | 0.47 | 0.47 | 0.00 | 0.37 | 0.37 | 0.47 | 0.47 | 0.47 | 0.44 | 0.47 |

TABLE 4-continued

|  | Glass composition No. | | | | | | | | | | |
| --- | --- | --- | --- | --- | --- | --- | --- | --- | --- | --- | --- |
|  | A | B | C | D | E | F | G | H | I | J | K |
| CuO | 0.00 | 1.78 | 0.00 | 0.00 | 0.00 | 1.68 | 1.68 | 0.00 | 0.19 | 1.37 | 0.84 |
| NiO | 0.00 | 0.00 | 1.65 | 0.00 | 0.00 | 0.00 | 0.00 | 0.17 | 0.00 | 1.28 | 0.00 |
| $Y_2O_3$ | 0.00 | 0.00 | 0.00 | 0.00 | 0.00 | 0.00 | 0.00 | 0.00 | 0.00 | 0.96 | 0.00 |
| CoO | 0.00 | 0.00 | 0.00 | 0.00 | 0.00 | 0.00 | 0.00 | 0.18 | 0.00 | 0.00 | 0.00 |
| $Fe_2O_3$ | 0.00 | 0.00 | 0.00 | 0.00 | 0.00 | 0.00 | 0.00 | 0.17 | 0.00 | 0.00 | 0.00 |
| $TiO_2$ | 0.00 | 0.00 | 0.00 | 0.00 | 0.00 | 0.00 | 0.00 | 0.00 | 0.37 | 0.00 | 0.00 |

Examples 1 to 13, Comparative Examples 1 to 20

7. Evaluation of Substrate for Flexible Device (Glass Layer Evaluation)

The sheets (Sheet Nos.) and the coating glass paste (Glass composition Nos.) are combined as indicated in Table 5 to produce substrates for flexible device. The glass firing step was conducted using electric furnace by drying (temperature: 110° C., time: 20 minutes), debinding (temperature: 330° C., time: 20 minutes) and firing (temperature: 750° C., time: 15 seconds).

For the obtained substrates for flexible device, bubbles in the glass layers, cissing and crystallization (seeding) were evaluated in the following manner. The results are indicated in Table 5.

The cissing is mainly caused by the bubbles. However, since a part of cissing may be caused by other factors, evaluation is classified into the item of bubbles and the item of all cissing (including the cissing caused by bubbles).

[Bubble Evaluation]

The bubble evaluation was conducted for substrates for flexible device each having a size of 100×100 mm, using an optical microscope. Specifically, the focus was shift from the surface of each sheet (interface between the glass layer and each sheet) to the glass layer surface so as to check presence of bubbles.

[Cissing Evaluation]

The cissing was evaluated by checking visually the substrate for flexible device of the same size of 100×100 mm and by counting the cissing number in accordance with the following criteria.

⊚: zero cissing
○: cissing number is less than 5
Δ: cissing number is 5 or more and less than 10
x: cissing number is 10 or more

[Crystallization Evaluation]

Occurrence of crystallization that can be observed visually was evaluated for substrates for flexible device of the same size of 100×100 mm

[Comprehensive Evaluation]

Comprehensive evaluation was conducted according to the criteria below, with reference to the bubble evaluation, the cissing evaluation and crystallization evaluation.

⊚: no bubble, no cissing, and no crystallization
○: some bubbles, cissing evaluation ○, no crystallization
Δ: some bubbles, cissing evaluation Δ, no crystallization
ΔΔ: some bubbles, cissing evaluation Δ, with crystallization
x: some bubbles, cissing evaluation x, no crystallization
xx: some bubbles, cissing evaluation x, with crystallization

TABLE 5

|  | Sheet No. | Glass composition No. | Glass layer surface Ra(nm) | Glass layer evaluation | | | |
| --- | --- | --- | --- | --- | --- | --- | --- |
|  |  |  |  | Comprehensive | Bubbles | Cissing | Crystallization |
| Example 1 | 1 | A | 0.33 | ⊚ | No | ⊚ | No |
| Example 2 | 1 | B | Unmeasured | ⊚ | No | ⊚ | No |
| Example 3 | 1 | C | Unmeasured | ⊚ | No | ⊚ | No |
| Example 4 | 1 | D | Unmeasured | ○ | Yes | ○ | No |
| Example 5 | 2 | A | 0.72 | ⊚ | No | ⊚ | No |
| Example 6 | 3 | A | 0.56 | ⊚ | No | ⊚ | No |
| Example 7 | 5 | A | 0.65 | ○ | Yes | ○ | No |
| Example 8 | 6 | A | 0.29 | ○ | Yes | ○ | No |
| Example 9 | 14 | A | Unmeasured | ○ | Yes | ○ | No |
| Example 10 | 15 | H | 0.30 | ⊚ | No | ⊚ | Yes |
| Example 11 | 15 | I | 0.30 | ⊚ | No | ⊚ | Yes |
| Example 12 | 15 | K | 0.45 | ⊚ | No | ⊚ | No |
| Example 13 | 1 | J | Unmeasured | ⊚ | No | ⊚ | No |
| Com. Ex.* 1 | 4 | A | 0.55 | X | Yes | X | No |
| Com. Ex. 2 | 7 | A |  | No evaluation due to glass layer peeling | | | No measurement |
| Com. Ex. 3 | 8 | A | 2.17 | X | Yes | X | No |
| Com. Ex. 4 | 9 | A | 1.04 | X | Yes | X | No |
| Com. Ex. 5 | 10 | A | 1.19 | X | Yes | X | No |
| Com. Ex. 6 | 11 | A | 0.94 | X | Yes | X | No |
| Com. Ex. 7 | 12 | A | Unmeasured | X | Yes | X | No |
| Com. Ex. 8 | 13 | A | Unmeasured | X | Yes | X | No |
| Com. Ex. 9 | 4 | B | Unmeasured | Δ | Yes | Δ | No |
| Com. Ex. 10 | 4 | C | Unmeasured | Δ | Yes | Δ | No |
| Com. Ex. 11 | 4 | D | Unmeasured | X | Yes | X | No |
| Com. Ex. 12 | 1 | E | Unmeasured | ΔΔ | Yes | Δ | Yes |
| Com. Ex. 13 | 4 | E | Unmeasured | X X | Yes | X | Yes |
| Com. Ex. 14 | 1 | F | Unmeasured | ΔΔ | Yes | Δ | Yes |

TABLE 5-continued

| | Glass Sheet No. | Glass composition No. | Glass layer surface Ra(nm) | Glass layer evaluation Comprehensive | Bubbles | Cissing | Crystallization |
|---|---|---|---|---|---|---|---|
| Com. Ex. 15 | 1 | G | Unmeasured | Δ | Yes | Δ | No |
| Com. Ex. 16 | 3 | G | Unmeasured | Δ | Yes | Δ | No |
| Com. Ex. 17 | 5 | G | Unmeasured | Δ | Yes | Δ | No |
| Com. Ex. 18 | 6 | G | Unmeasured | Δ | Yes | Δ | No |
| Com. Ex. 19 | 4 | G | Unmeasured | X | Yes | X | No |
| Com. Ex. 20 | 4 | J | Unmeasured | Δ | Yes | Δ | No |

Com. Ex.*Comparative Example

8. Oxygen Amount on (Nickel-Plating Layer/Glass Layer) Interface

Figure 7A:
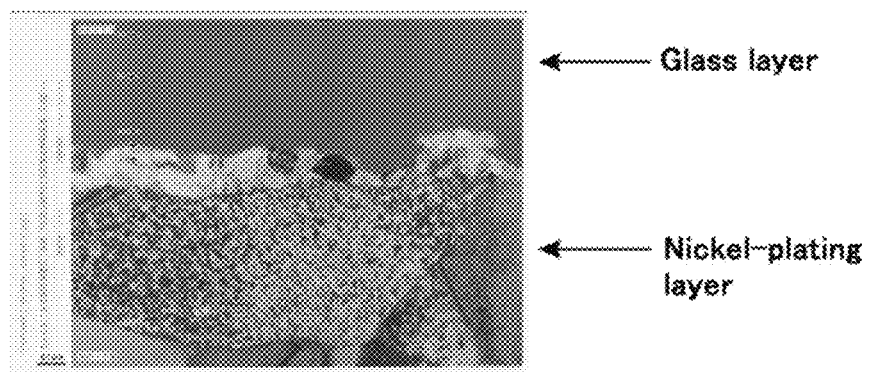
FIGS. 7A and 7B are TEM photographs of the interface between the nickel-plating layer and the glass layer for Example 12 and Comparative Example 1 in Table 5. Therein.
Figure 7B:
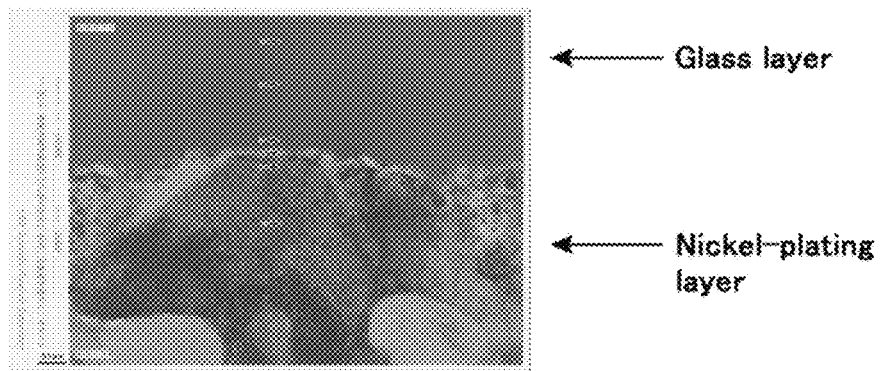

For Example 12 and Comparative Example 1, the oxygen amount inside the glass layer (a site close to the glass by 0.4 μm from the (nickel-plating layer/glass layer) interface) and the oxygen amount on the (nickel-plating layer/glass layer) interface were measured using a field emission type TEM (transmission electron microscope). When the oxygen amount inside the glass layer was set to 100%, the oxygen amount on the (nickel-plating layer/glass layer) interface was 89.1% in Example 12, while the same amount was 75.3% in Comparative Example 1. FIG. 7A is a TEM photograph showing the (nickel-plating layer/glass layer) interface of Example 12, and FIG. 7B is a TEM photograph showing the (nickel-plating layer/glass layer) interface of Comparative Example 1.

Experimental Examples 1 to 7

The substrate for flexible device in Example 12 was cut into small pieces of 20 mm×20 mm, and the glass layer surface was washed by a method mentioned below. On the thus washed glass layer surface, an underlying layer comprising nickel and indium tin oxide (tin oxide: 10% by weight) was formed according to a film formation method as mentioned below, and on the underlying layer, an electrode layer (anode) comprising aluminum was formed. The substrate for flexible device was evaluated after forming the electrode. Table 6 below indicates types, thickness, film formation rates and evaluation results for the underlying layer and the electrode layer.

[Washing Method]
The substrate was washed with a detergent, ion-exchange water and alcohol sequentially in this order, and dried with a dryer.
[Film Formation Method]
(1) A washed substrate for flexible device was set in an RF magnetron sputtering device, and evacuated to the order of $1\times10^{-5}$ Pa.
(2) Argon (Ar) was introduced such that the pressure inside the film formation chamber would be 0.3 Pa.
(3) Film formation was conducted for a predetermined time at a film formation rate indicated in Table 6.
[Evaluation Method]
The evaluation was conducted for both the cross-cut area and the area other than the cross-cut area by a tape-peeling method.

The cross-cut area was formed by cutting in accordance with the cross-cut method including the steps of the following (1) to (4) (in compliance with JIS K5600-5-6). After peeling the tape, the number of unpeeled lattices among 25 lattices was counted. As to the area other than the cross-cut area, occurrence of peeling was checked.

(1) A right-angle lattice pattern with 2 mm interval is cut into the coating surface with a knife (2 mm interval, 25 lattices).
(2) A pressure-sensitive adhesive tape (special acrylic pressure-sensitive adhesive PPS-15 supplied by 3M Company) is stuck on the lattice pattern, rubbed with a plastic eraser to adhere the pressure-sensitive adhesive tape.
(3) The pressure-sensitive adhesive tape is removed by pulling it off at an angle which is as close as possible to 60°.
(4) The number of lattices that are formed in the coated area and not peeled by the pressure-sensitive adhesive tape is counted.

TABLE 6

| | Glass Sheet No. | composition No. | Underlying layer Type | Thickness (nm) | Film formation rate (nm/min) | Anode layer Type | Thickness (nm) | Film formation rate (nm/min) | Evaluation result Cross-cut area (number of unpeeled lattices among 25 lattices) | Area other than cross-cut area |
|---|---|---|---|---|---|---|---|---|---|---|
| Experimental Example 1 | 15 | K | Ni | 50 | 6.0 | Al | 450 | 7.1 | 5 | No peeling |
| Experimental Example 2 | 15 | K | Ni | 50 | 18.4 | Al | 450 | 7.1 | 4 | No peeling |
| Experimental Example 3 | 15 | K | Ni | 50 | 18.4 | Al | 450 | 27.1 | 4 | No peeling |
| Experimental Example 4 | 15 | K | ITO | 50 | 12.1 | Al | 450 | 27.1 | 10 | No peeling |
| Experimental Example 5 | 15 | K | ITO | 50 | 41.5 | Al | 450 | 27.1 | 14 | No peeling |
| Experimental Example 6 | 15 | K | Without underlying layer | | | Al | 500 | 7.1 | 0 | No peeling |

TABLE 6-continued

| | | | Underlying layer | | | Anode layer | | Evaluation result | |
| | | | | | | | | Cross-cut area | |
| | Glass Sheet No. | composition No. | Type | Thickness (nm) | Film formation rate (nm/min) | Type | Thickness (nm) | Film formation rate (nm/min) | (number of unpeeled lattices among 25 lattices) | Area other than cross-cut area |
|---|---|---|---|---|---|---|---|---|---|---|
| Experimental Example 7 | 15 | K | Without underlying layer | | | Al | 500 | 27.1 | 0 | No peeling |

Experiment B

Example 1-9, Comparative Example 1-3

For the glass composition, the bismuth-based glass compositions as indicated in Table 7 were used.

◎: No cissing
○: cissing number is less than 5
Δ: cissing number is 5 or more and less than 10
x: cissing number is 10 or more

[Crystallization]

For a substrate for flexible device of 100×100 mm, crystallization that can be observed visually was evaluated.

TABLE 7

| | | Example 1 | Example 2 | Example 3 | Example 4 | Example 5 | Example 6 | Example 7 | Example 8 | Example 9 | Comparative Example 1 | Comparative Example 2 | Comparative Example 3 |
|---|---|---|---|---|---|---|---|---|---|---|---|---|---|
| Component (wt %) | $Bi_2O_3$ | 81.12 | 79.65 | 75.42 | 79.77 | 78.86 | 78.16 | 82.61 | 80.66 | 80.61 | 83.88 | 78.71 | 81.04 |
| | ZnO | 10.89 | 10.70 | 10.41 | 10.70 | 10.60 | 10.50 | 11.08 | 10.84 | 10.85 | 8.75 | 12.18 | 9.30 |
| | $B_2O_3$ | 6.21 | 6.09 | 10.24 | 6.10 | 6.04 | 6.00 | 6.31 | 6.20 | 6.20 | 5.78 | 5.94 | 6.20 |
| | $SiO_2$ | 1.31 | 1.31 | 1.50 | 1.31 | 1.31 | 1.29 | 0.00 | 1.31 | 1.31 | 1.22 | 1.12 | 1.31 |
| | $Al_2O_3$ | 0.47 | 0.47 | 0.47 | 0.47 | 0.47 | 0.44 | 0.00 | 0.47 | 0.47 | 0.37 | 0.37 | 0.47 |
| | CuO | 0.00 | 1.78 | 1.96 | 0.00 | 1.40 | 1.37 | 0.00 | 0.00 | 0.19 | 0.00 | 1.68 | 1.68 |
| | NiO | 0.00 | 0.00 | 0.00 | 1.65 | 1.32 | 1.28 | 0.00 | 0.17 | 0.00 | 0.00 | 0.00 | 0.00 |
| | $Y_2O_3$ | 0.00 | 0.00 | 0.00 | 0.00 | 0.00 | 0.96 | 0.00 | 0.00 | 0.00 | 0.00 | 0.00 | 0.00 |
| | CoO | 0.00 | 0.00 | 0.00 | 0.00 | 0.00 | 0.00 | 0.00 | 0.18 | 0.00 | 0.00 | 0.00 | 0.00 |
| | $Fe_2O_3$ | 0.00 | 0.00 | 0.00 | 0.00 | 0.00 | 0.00 | 0.00 | 0.17 | 0.00 | 0.00 | 0.00 | 0.00 |
| | $TiO_2$ | 0.00 | 0.00 | 0.00 | 0.00 | 0.00 | 0.00 | 0.00 | 0.00 | 0.37 | 0.00 | 0.00 | 0.00 |
| Glass layer evaluation | Cissing | ◎ | ◎ | Δ | ○ | ◎ | ◎ | ○ | ○ | ○ | X | X | X |
| | Crystallization | No | No | No | No | No | No | No | No | No | Yes | Yes | No |

For the vehicle, a vehicle comprising methyl cellulose as an organic binder and water as a solvent blended at a weight ratio of 1:99 was used.

The glass composition powders as indicated in Table 7 and the vehicle were mixed in a mortar so that the weight ratio would be 50:50. The mixture was dispersed with a ceramic roll so as to produce a glass paste for forming a glass layer.

For the substrate, a nickel-plated steel sheet was used. The surface of the sheet was wiped off with gauze soaked in alcohol for degreasing, and then, treated with heat. On the baked nickel-plating layer, a glass paste was coated with a bar coater such that the thickness would be 20 μm after being fired, whereby a coating was formed. Then, the coated substrate was dried (temperature: 120° C., time: 20 minutes) and fired (temperature: 750° C., time: 15 seconds) by use of an electric furnace, whereby a substrate for flexible device was formed.

(Evaluation Result)

The thus formed glass layer was evaluated for cissing in the glass film and occurrence of crystallization (seeding) as described below. The results are indicated in Table 7.

The evaluation criteria are as follows.

[Evaluation Criteria for Cissing]

For a substrate for flexible device of 100×100 mm, cissing that can be observed visually was evaluated according to the following evaluation criteria.

INDUSTRIAL APPLICABILITY

The substrate for flexible device of the present invention is excellent in moisture barrier properties, insulating properties, surface smoothness of glass layer and adhesion, and thus, it can be suitably used as a substrate for an organic EL lighting, an organic EL display, an organic thin film solar cell and the like.

The sheet which is used for substrate for flexible device of the present invention is excellent in adhesion to the glass layer and furthermore it can effectively prevent occurrence of surface defects such as cissing on the surface of the glass layer to be formed. Therefore, it can be used especially suitably as a sheet which is used for substrate for a flexible device such as an organic EL lighting, an organic EL display, an organic thin film solar cell and the like, since such a sheet includes the glass layer as an insulating layer.

Further, the sheet which is used for substrate for flexible device of the present invention can be used particularly preferably for an article on which the glass layer to be formed. It is also possible to form an inorganic film by sputtering or vapor deposition, or a resin film of polyimide rein or the like, without any particular limitation.

Since the bismuth-based lead-free glass composition of the present invention can be used to form a glass layer with excellent smoothness free from seeding or cissing, it can be utilized effectively for a substrate for electronic device, in particular, a substrate for flexible device that can be used for organic EL.

EXPLANATIONS OF LETTERS OR NUMERALS 1 sheet which is used for substrate for flexible device
2 substrate for flexible device
3 substrate for organic EL device
10 metal sheet
11 nickel-plating layer
12 oxide layer
13 glass layer
14 underlying layer
20 electrode layer (Ag, Al)
21 organic thin film light-emitting layer
22 transparent electrode layer
23 transparent sealing layer
24 transparent sealing member
25 corrosion-resistant layer

What is claimed is:

1. A sheet for a flexible device, the sheet including either a nickel-plated metal sheet including a nickel-plating layer formed on at least one surface of a metal sheet or a nickel-based sheet, wherein a roughened oxide layer is formed on either the surface of the nickel-plating layer or the surface of the nickel-based sheet,
wherein the oxide layer has an arithmetic mean roughness (Ra) in a range of 30 to 100 nm, and
wherein the oxide layer has a surface having maximum height roughness (Rz) in a range of 420 to 900 nm.

2. The sheet for a flexible device according to claim 1, wherein the oxide layer has a thickness in a range of 40 to 1200 nm.

3. The sheet for a flexible device according to claim 1, wherein the oxide layer has a thickness in a range of 500 to 1000 nm.

4. The sheet for a flexible device according to claim 1, wherein iron is present in the oxide layer.

5. The sheet for a flexible device according to claim 4, wherein the iron present in the oxide layer includes metallic iron of not more than 3 atomic %.

6. The sheet for a flexible device according to claim 1, wherein the oxide layer contains oxygen of not less than 30 atomic %.

7. The sheet for a flexible device according to claim 1, wherein the oxide layer includes metallic nickel of not more than 20 atomic %.

8. A method for producing the sheet for a flexible device according to claim 1, including baking in an oxygen-containing atmosphere the nickel-plated metal sheet having the nickel-plating layer formed on at least one surface of the metal sheet or the nickel-based sheet to form the oxide layer on either the surface of the nickel-plating layer or the surface of the nickel-based sheet.

* * * * *